(12) United States Patent
Lim et al.

(10) Patent No.: US 6,599,807 B2
(45) Date of Patent: Jul. 29, 2003

(54) METHOD FOR MANUFACTURING CAPACITOR OF SEMICONDUCTOR DEVICE HAVING IMPROVED LEAKAGE CURRENT CHARACTERISTICS

(75) Inventors: Jae-soon Lim, Seoul (KR); Seung-hwan Lee, Seoul (KR); Han-mei Choi, Seoul (KR); Yun-jung Lee, Seoul (KR); Gab-jin Nam, Suwon (KR); Ki-yeon Park, Seoul (KR); Young-sun Kim, Seoul (KR); Sung-tae Kim, Seoul (KR)

(73) Assignee: Samsung Electronics, Co., LTD, Kyungki Do (KR)

( * ) Notice: Subject to any disclaimer, the term of this patent is extended or adjusted under 35 U.S.C. 154(b) by 0 days.

(21) Appl. No.: 10/034,043

(22) Filed: Dec. 20, 2001

(65) Prior Publication Data

US 2003/0036239 A1 Feb. 20, 2003

(51) Int. Cl.$^7$ ............................................. H01L 29/72
(52) U.S. Cl. ................. 438/396; 438/240; 438/250; 438/393; 438/770; 438/775; 438/239
(58) Field of Search .................. 438/239, 240, 438/250, 210, 393, 396, 770, 775, FOR 430

(56) References Cited

U.S. PATENT DOCUMENTS

| | | | | |
|---|---|---|---|---|
| 5,468,684 A | * | 11/1995 | Yoshimori et al. |
| 5,605,858 A | * | 2/1997 | Nishioka et al. |
| 5,619,393 A | * | 4/1997 | Summerfelt et al. |
| 5,864,153 A | * | 1/1999 | Nagel et al. |
| 5,994,153 A | * | 11/1999 | Nagel et al. |
| 6,171,941 B1 | * | 1/2001 | Park et al. |
| 6,348,420 B1 | * | 2/2002 | Raaijmakers et al. |
| 6,352,898 B2 | * | 3/2002 | Yang et al. |
| 6,372,667 B1 | * | 4/2002 | Lee |
| 6,387,749 B1 | * | 5/2002 | Lim |
| 6,399,459 B2 | * | 6/2002 | Al-Shareef et al. |
| 2002/0074584 A1 | * | 6/2002 | Yang |

* cited by examiner

Primary Examiner—George Fourson
Assistant Examiner—Joannie Adelle Garcia
(74) Attorney, Agent, or Firm—F. Chau & Associates, LLP

(57) ABSTRACT

A method for manufacturing a capacitor of a semiconductor device is provided. The method includes the steps of: forming a first electrode on a semiconductor substrate; forming a dielectric layer on the first electrode; forming a second electrode on the dielectric layer; first annealing the capacitor having the first electrode, the dielectric layer, and the second electrode under oxygen atmosphere; and second annealing the capacitor having the first electrode, the dielectric layer, and the second electrode under vacuum.

17 Claims, 5 Drawing Sheets

METHOD FOR MANUFACTURING CAPACITOR OF SEMICONDUCTOR DEVICE HAVING IMPROVED LEAKAGE CURRENT CHARACTERISTICS

BACKGROUND OF THE INVENTION

1. Field of the Invention

The present invention relates to a method of manufacturing a semiconductor device, and more particularly, to a method of manufacturing a capacitor having improved leakage current characteristics.

2. Description of the Related Art

As the degree of integration of semiconductor memory devices such as dynamic random access memory (DRAM) increases, methods of increasing the effective area of a capacitor, methods of reducing the thickness of a dielectric layer, and methods of increasing dielectric constant of the dielectric film are used to increase the amount of charge accumulated in a given cell area.

As is well known to those skill in the art, a capacitor includes first and second spaced-apart conductive electrodes with a dielectric layer therebetween. The first conductive electrode is often referred to as a storage electrode and the second conductive electrode is often referred to as a plate electrode. To increase the capacitance of a capacitor having a given physical size, the dielectric constant of the dielectric layer can be increased. Many materials have been investigated for their high dielectric constant. For example, tantalum pentoxide ($Ta_2O_5$), aluminum oxide ($Al_2O_3$), and titanium dioxide ($TiO_2$) have been widely used, but they exhibited problems such as unacceptably large leakage current in thin films, when material having high dielectric constant is used for the capacitor, a polysilicon layer and a titanium nitride (TiN) layer are generally used for the first conductive electrode and the second conductive electrode of the capacitor, respectively. However, the interfaces between the first conductive electrode and the dielectric layer and between the dielectric layer and the second conductive electrode are unstable. When the interfaces are unstable, leakage current characteristics are distorted, rendering the semiconductor device unstable.

To reduce unstable characteristics between the first conductive electrode and the dielectric layer, a silicon nitride (SiN) layer formed therebetween may be used. The SiN layer may be formed on the polysilicon layer by a rapid thermal nitridation (RTN) process, the polysilicon layer being formed as the first conductive electrode. And then, the dielectric layer is formed on the SiN layer to reduce unstable characteristics. But, in case of using tantalum pentoxide ($Ta_2O_5$), aluminum oxide ($Al_2O_3$), and titanium dioxide ($TiO_2$) as a dielectric layer, the RTN process may not be used between the dielectric layer and second conductive electrode such as TiN because of absence of silicon in the dielectric layer.

Accordingly, a need exists for a method of manufacturing a capacitor having improved leakage current characteristics.

SUMMARY OF THE INVENTION

A method for manufacturing a capacitor of a semiconductor device is provided, which includes the steps of: forming a first electrode on a semiconductor substrate; forming a dielectric layer on the first electrode; forming a second electrode on the dielectric layer; first annealing the capacitor having the first electrode, the dielectric layer, and the second electrode under oxygen atmosphere; and second annealing the capacitor having the first electrode, the dielectric layer, and the second electrode under vacuum.

According to an aspect of the present invention, the method further includes the step of forming a buffer layer on the first electrode. The buffer layer is formed by rapid thermal nitridation (RTN) with a plasma of gases including one of nitrogen and oxygen. The gases including nitrogen includes a gas selected from the group consisting of $NH_3$, $N_2O$, and $N_2$. The gases including oxygen includes a gas selected from the group consisting of $N_2O$, $O_2$, and a gas from a hydroxyl group. The buffer layer includes a layer formed from a material selected from the group consisting of $Si_3N_4$ and SiON.

According to a preferred embodiment of the present invention, the first electrode includes a layer formed from a material selected from the group consisting of polysilcon, tantalum (Ta), titanium (Ti), platinum (Pt), molybdenum (Mo), tantalum (Ta) nitride, titanium (Ti) nitride, and molybdenum (Mo) nitride. The first electrode includes impurity doped polysilicon.

According to a preferred embodiment of the present invention, the dielectric layer includes a layer formed from a material selected from the group consisting of silicon nitride, silicon oxide, tantalum oxide ($Ta_2O_5$), aluminum oxide ($Al_2O_3$), and titanium oxide ($TiO_2$). The second electrode includes a layer formed from a material selected from the group consisting of polysilicon, tantalum (Ta), titanium (Ti), platinum (Pt), molybdenum (Mo), tantalum (Ta) nitride, titanium (Ti) nitride, and molybdenum (Mo) nitride.

According to a preferred embodiment of the present invention, the step of the first annealing is performed using oxygen containing gas at a temperature of about 200° C. to about 500° C. The oxygen containing gas includes a gas selected from the group consisting of $O_2$ gas, $N_2O$ gas, $O_3$ gas, and mixtures thereof. The oxygen containing gas comprises oxygen of about 0.01% to about 100%. The step of the second annealing is performed at a temperature of about 300° C. to about 700° C.

BRIEF DESCRIPTION OF THE DRAWINGS

The above and other objects and advantages of the present invention will become more apparent by describing in detail preferred embodiments thereof with reference to the accompanying drawings in which.

DETAILED DESCRIPTION OF PREFERRED EMBODIMENTS

Hereinafter, embodiments of the present invention will be described in detail with reference to the attached drawings.

However, the embodiments of the present invention may be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity. Like numbers refer to like elements throughout. Also, when it is written that a layer is formed "on" another layer or a substrate, the layer may be formed directly on the other layer or the substrate, or other layers may intervene therebetween.

Figure 1:
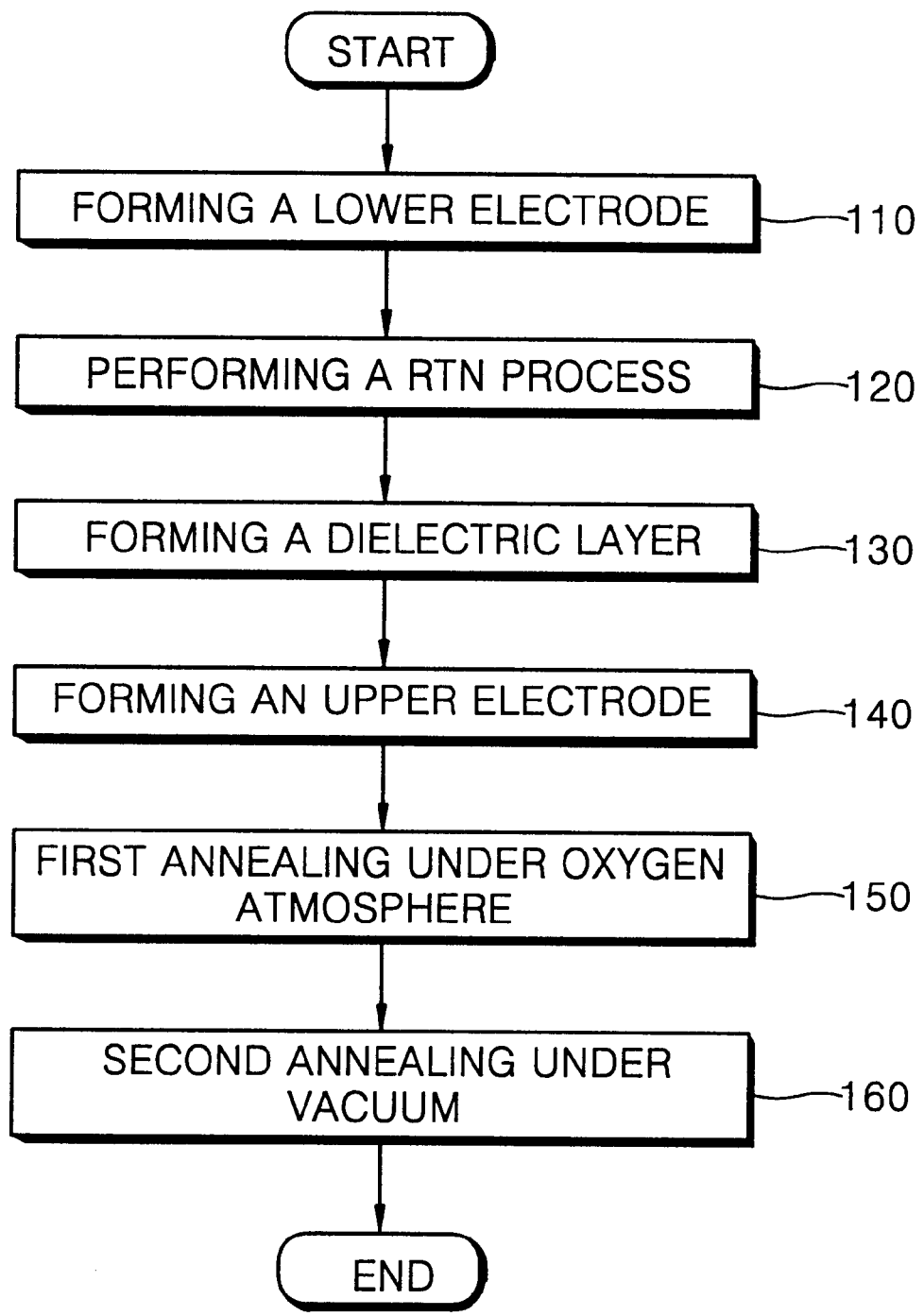
FIG. 1 is a flow chart illustrating a method for forming a capacitor in a semiconductor device according to the present invention.
Figure 2:
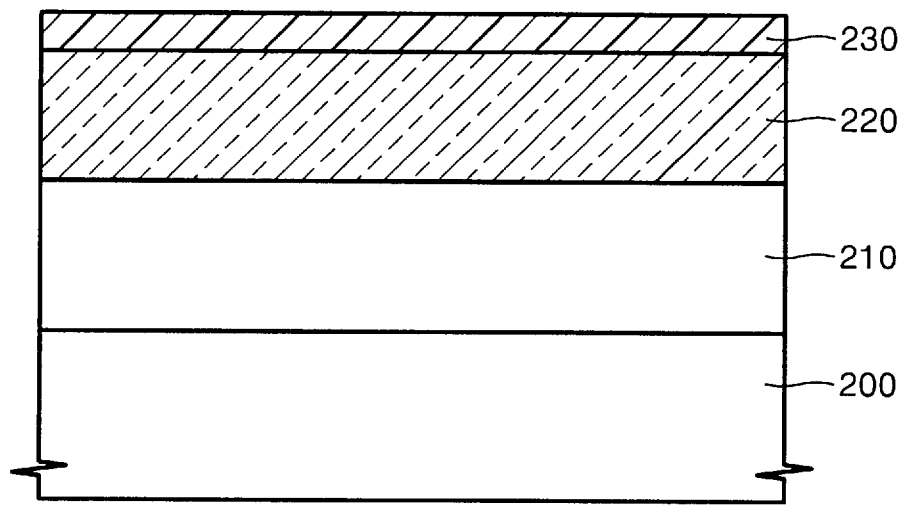
FIGS. 2 and 3 are cross-sectional views of structures for forming a capacitor according to the present invention.
Figure 3:
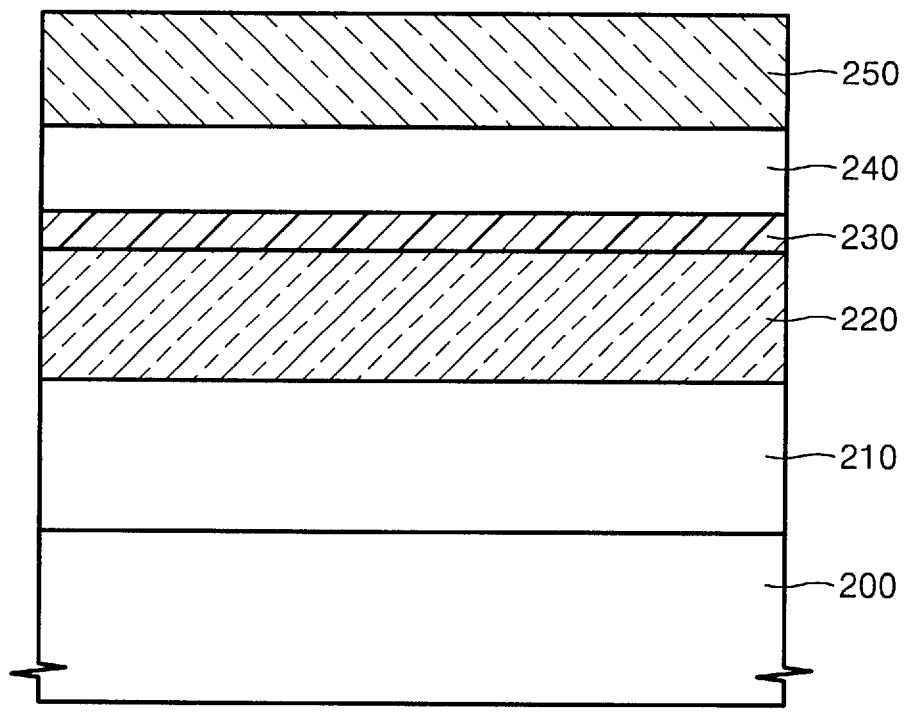

FIG. 1 is a flow chart illustrating a method for forming a capacitor in a semiconductor device according to the present invention. FIGS. 2 and 3 are cross-sectional views of structures for describing steps in forming a capacitor after performing each stage of the flow chart of FIG. 1.

Referring to FIGS. 1, 2, and 3, an insulating layer 210 covers a semiconductor substrate 200, and a lower electrode 220 is formed on the insulating layer 210 (Stage 110 in FIG. 1). The lower electrode 220 is formed from a layer of polysilcon, tantalum (Ta), titanium (Ti), platinum (Pt), molybdenum (Mo), tantalum (Ta) nitride, titanium (Ti) nitride, or molybdenum (Mo) nitride. Alternatively, the lower electrode 220 can be formed from two or more layers of the above mentioned materials. The polysilicon is impurity doped polysilcon, and preferably p-type impurity doped polysilicon. Even though the insulating layer 210 describes insulating material between the lower electrode 220 and the semiconductor substrate 200 in FIG. 2, some portions between the lower electrode 220 and the semiconductor substrate 200 can be connected therebetween if needed.

Next, rapid thermal nitridation (RTN) process is performed (Stage 120 in FIG. 1) as follows. The exposed surface of the lower electrode 220 is preprocessed to reduce any natural oxide which may form thereon and to reduce defects on the lower electrode 220. According to a preferred embodiment of the present invention, the lower electrode 220 is treated with plasma of a gas or gases including nitrogen and oxygen. The gas including nitrogen and the gas including oxygen can be provided sequentially or simultaneously. The gas including nitrogen can be $NH_3$, $N_2O$, or $N_2$, and the gas including oxygen can be $N_2O$, $O_2$, or a gas having a hydroxyl (OH) group. For example, the lower electrode 220 can be preprocessed using plasma $NH_3$ treatment and plasma $O_2$ treatment which are performed sequentially or simultaneously. Alternatively, single plasma $N_2O$ treatment can be used. By performing RTN process, a buffer layer 230 is formed on the lower electrode 220. The buffer layer 230 is formed from a $Si_3N_4$ layer or a SiON layer. Alternatively, the buffer layer 230 is formed from a $SiO_2$ layer on the lower electrode 220 by performing heat treatment.

Referring to FIG. 3, a dielectric layer 240 is formed on the buffer layer 230 (Stage 130 in FIG. 1). The dielectric layer 240 is formed from high dielectric constant material. Preferably, the dielectric layer 240 is formed from a layer of silicon nitride, silicon oxide, tantalum oxide ($Ta_2O_5$), aluminum oxide ($Al_2O_3$), or titanium oxide ($TiO_2$). Alternatively, the dielectric layer 240 can be formed from two or more layers of the above mentioned material.

Next, an upper electrode 250 is formed on the dielectric layer 240 (Stage 140 in FIG. 1). The upper electrode 250 can be formed from a layer of polysilicon, tantalum (Ta), titanium (Ti), platinum (Pt), molybdenum (Mo), tantalum (Ta) nitride, titanium (Ti) nitride, or molybdenum (Mo) nitride. Alternatively, the upper electrode 250 can be formed from two or more layers of the above mentioned material.

The resulting structure can then be subjected to a first annealing under oxygen atmosphere (Stage 150 in FIG. 1). For the first annealing process, the gas including oxygen can be provided to the annealing process. The gas including oxygen can be $O_2$, $N_2O$, or $O_3$. And the content of oxygen in the process gas is about 0.01% to about 100%. The first annealing temperature is about 200° C. to about 500° C. The first annealing is performed in-situ or in a furnace.

After performing the first annealing, a second annealing is performed under vacuum (Stage 160 in FIG. 1). The temperature of the second annealing process is about 300° C. to about 700° C. During the first and second annealing process, unstable surface between the dielectric layer 240 and the upper electrode 250 is cured by oxygen gas, thereby improving leakage current characteristics of the semiconductor device.

For the test of leakage current, the capacitor is formed as follows: the capacitor is formed from polysilicon as a lower electrode, $Ti_2O_5$ as a dielectric layer, and TiN as an upper electrode; RTN is performed after the step of forming the lower electrode and before the step of forming a dielectric layer; After forming an upper electrode, first annealing is performed at a temperature of about 400° C. under about 5% of oxygen of the process gas in a furnace.

Figure 4:
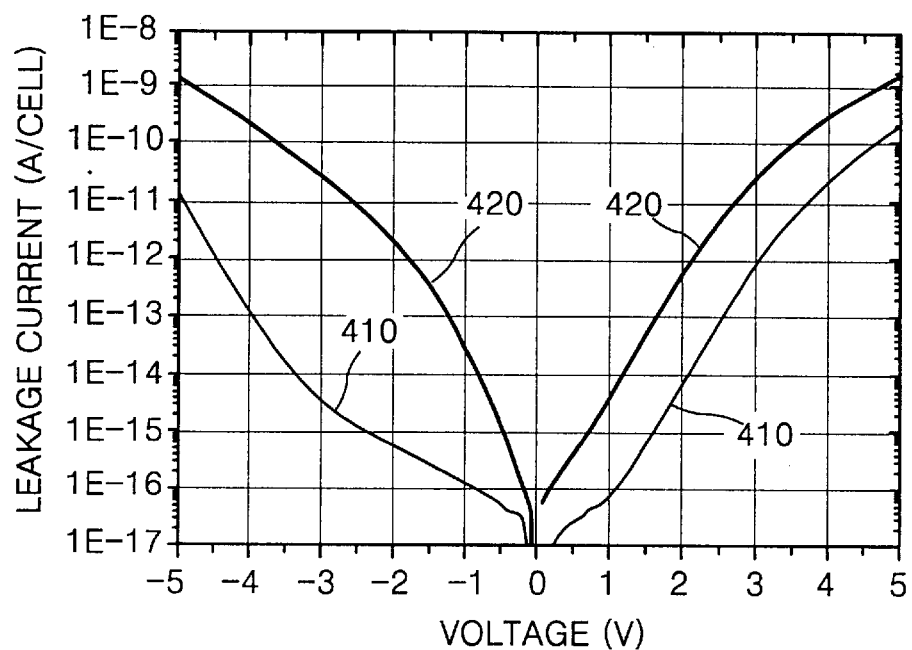
FIG. 4 is a graph showing leakage current measured at the capacitor.

FIG. 4 is a graph illustrating results obtained by measuring leakage current generated when an electrical bias is applied across the electrodes of the capacitor. The abscissa and the ordinate represent applied bias voltages and leakage current, respectively. The numeral 410 denotes leakage current of the capacitor after performing first annealing under oxygen atmosphere according to the present invention, and the numeral 420 denotes leakage current of a conventional capacitor which has not been performed first annealed. As shown in FIG. 4, when first annealing is performed according to the present invention, improved leakage current characteristics are obtained in positive and negative voltages.

Figure 5:
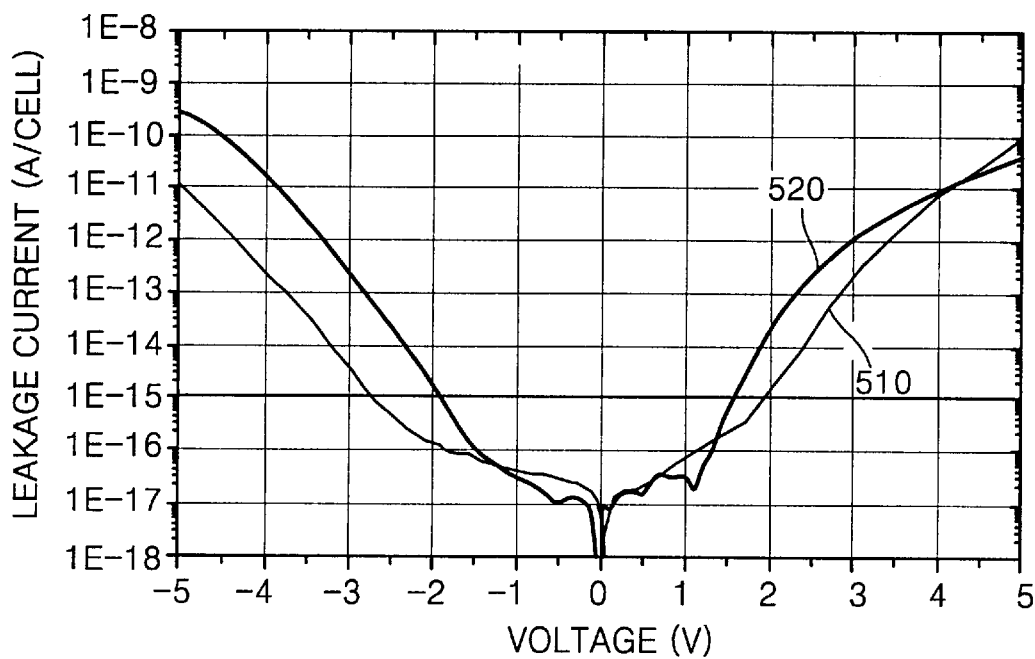
FIG. 5 is another graph showing leakage current measured at the capacitor.

FIG. 5 is a graph illustrating results obtained by measuring leakage current generated when an electrical bias is applied across the electrodes of the capacitor. The abscissa and the ordinate represent applied bias voltages and leakage current, respectively. The numeral 510 denotes leakage current of the capacitor after performing first annealing under oxygen atmosphere and second annealing under vacuum according to the present invention. The numeral 520 denotes leakage current of a conventional capacitor not performing first and second annealing. As shown in FIG. 5, the leakage current is generally decreased after performing the first and second annealing in both positive and negative voltages.

Figure 6A:
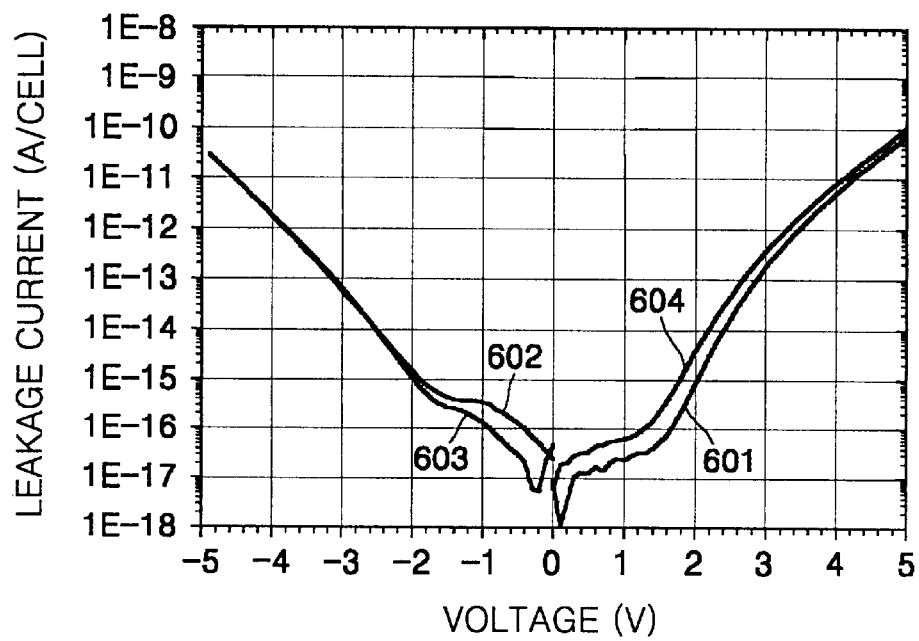
FIGS. 6a and 6b are graphs of leakage current measurements at the capacitor after the capacitor is first annealed under oxygen atmosphere.
Figure 6B:
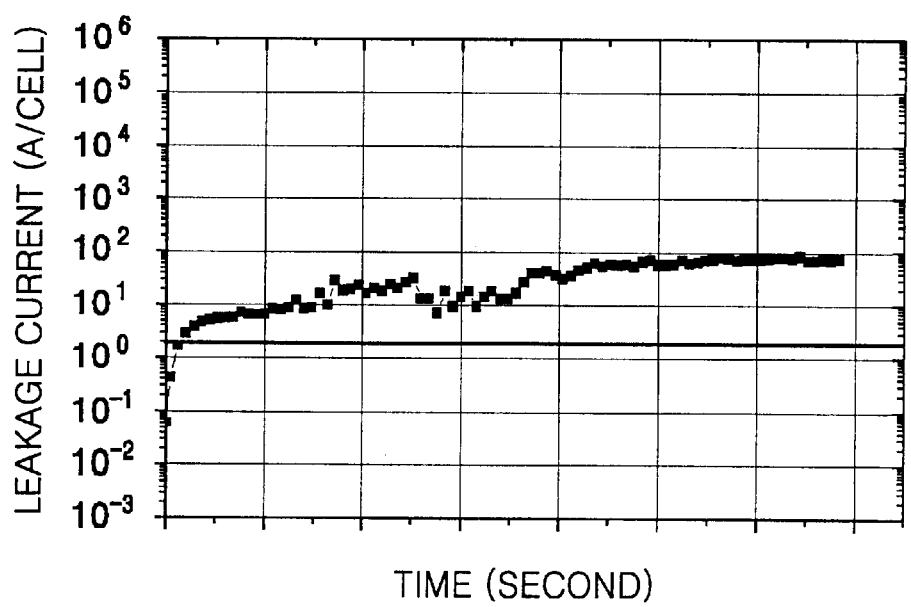

FIGS. 6a and 6b are graphs illustrating results obtained by measuring leakage current generated when an electrical bias is applied across the electrodes of the capacitor after performing first annealing under oxygen atmosphere according to the present invention. In detail, the capacitor is only treated at a temperature of about 400° C. under about 5% of oxygen of the process gas in a furnace. After first annealing, biases are applied across the electrodes of capacitors in serial. The abscissa and the ordinate represent applied bias voltages and leakage current, respectively. The numerals 601, 602, 603, and 604 are order of the bias applications. As shown in FIG. 6a, in case of only annealing, the variances of leakage current are large, and especially large in the low voltage.

FIG. 6b shows variation of leakage current according to time at the bias of 1.0 V. As shown in FIG. 6b, the leakage current is rapidly increased at the beginning.

Figure 7A:
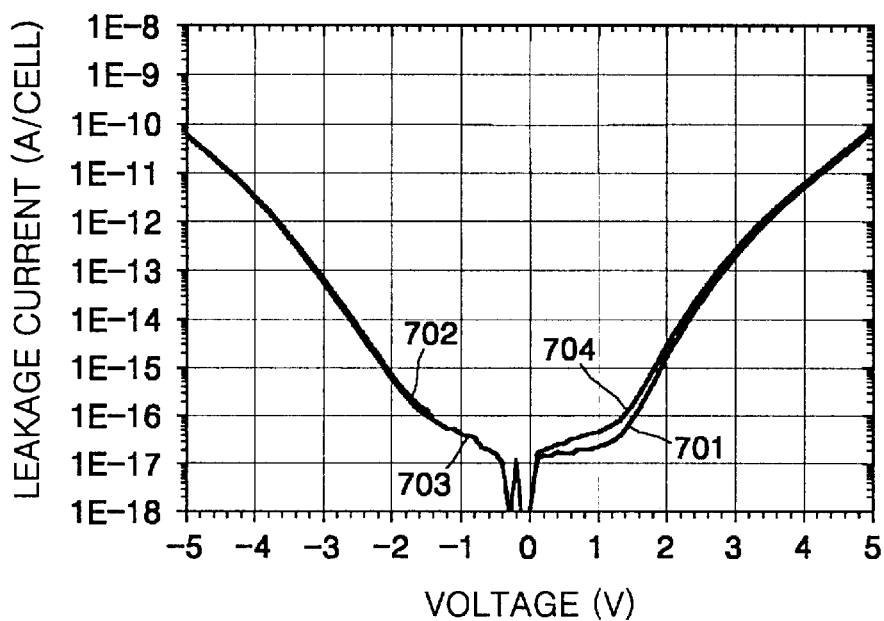
FIGS. 7a and 7b are graphs of leakage current measurements at the capacitor after the capacitor is first annealed under oxygen atmosphere and then second annealed under vacuum.
Figure 7B:
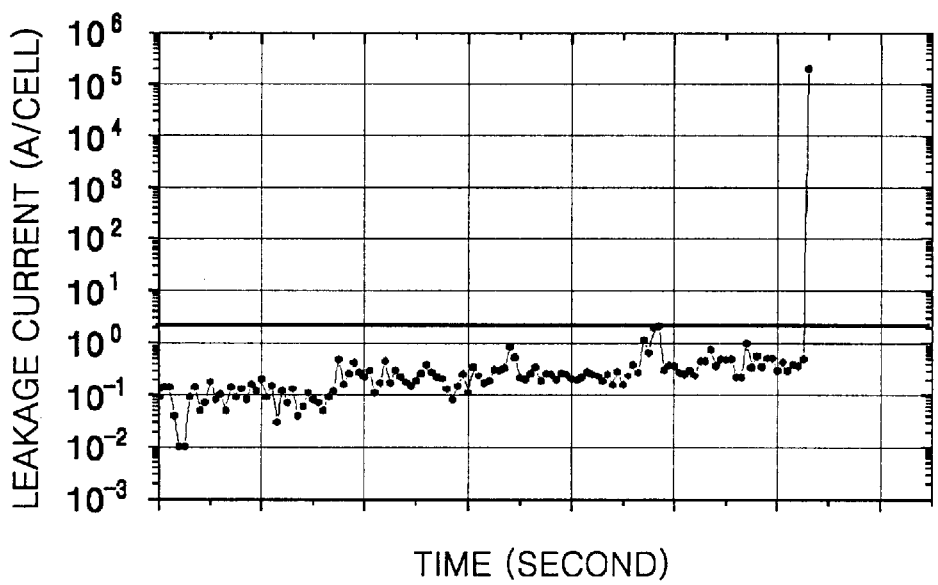

FIGS. 7a and 7b are graphs illustrating results obtained by measuring leakage current generated when an electrical bias is applied across the electrodes of capacitors after performing first annealing under oxygen atmosphere and second annealing under vacuum. In detail, the capacitor is annealed at a temperature of about 400° C. under about 5% of oxygen of the process gas as a first annealing, and annealed at a temperature of about 400° C. under vacuum as a second annealing. After annealing, bias voltages are applied to the capacitor. The numerals 701, 702, 703, and 704 show variances of leakage current measured at the capacitor, and are the order of the biases. As shown in FIG. 7a, in case of annealing under oxygen atmosphere and vacuum, the variances of leakage current are very small.

According to a method of forming a capacitor of the semiconductor device, after forming a dielectric layer having a higher dielectric constant value and an upper electrode composed of titanium nitride, the interface between dielectric layer and the upper electrode is stabilized by the first annealing under oxygen atmosphere and second annealing under vacuum, thereby preventing increase in leakage current.

Although the present invention has been described herein with reference to the accompanying drawings, it is to be understood that the present invention is not limited to those precise embodiments, and various other changes and modifications may be affected therein by one skilled in the art without departing from the scope or spirit it will be apparent to one of ordinary skill in the art that modifications of the described embodiment may be made without departing from the spirit and scope of the invention. All such changes and modifications are intended to be included within the scope of the invention as defined by the appended claims.

What is claimed is:

1. A method for manufacturing a capacitor of a semiconductor device, the method comprising the steps of:

forming a first electrode on a semiconductor substrate;

forming a buffer layer on the first electrode;

forming a dielectric layer on the buffer layer;

forming a second electrode on the dielectric layer;

first annealing the capacitor having the first electrode, the buffer layer, the dielectric layer, and the second electrode; and second annealing the capacitor under vacuum, wherein the capacitor includes the first electrode, the buffer layer, the dielectric layer, and the second electrode.

2. The method of claim 1, the step of first annealing the capacitor is performed under oxygen atmosphere.

3. The method of claim 1, wherein the buffer layer is formed by rapid thermal nitridation (RTN) with a plasma of gases including one of nitrogen and oxygen.

4. The method of claim 3, wherein the gases including nitrogen includes a gas selected from the group consisting of $NH_3$, $N_2O$, and $N_2$.

5. The method of claim 3, wherein the gases including oxygen includes a gas selected from the group consisting of $N_2O$, $O_2$, and a gas from a hydroxyl group.

6. The method of claim 1, wherein the buffer layer includes a layer formed a material selected from the group consisting of $Si_3N_4$ and SiON.

7. The method of claim 1, wherein the first electrode includes a layer formed from a material selected from the group consisting of polysilcon, tantalum (Ta), titanium (Ti), platinum (Pt), molybdenum (Mo), tantalum (Ta) nitride, titanium (Ti) nitride, and molybdenum (Mo) nitride.

8. The method of claim 1, wherein the first electrode includes impurity doped polysilicon.

9. The method of claim 1, wherein the dielectric layer includes a layer formed from a material selected from the group consisting of silicon nitride, silicon oxide, tantalum oxide ($Ta_2O_5$), aluminum oxide ($Al_2O_3$), and titanium oxide ($TiO_2$).

10. The method of claim 1, wherein the second electrode includes a layer formed from a material selected from the group consisting of polysilicon, tantalum (Ta), titanium (Ti), platinum (Pt), molybdenum (Mo), tantalum (Ta) nitride, titanium (Ti) nitride, and molybdenum (Mo) nitride.

11. The method of claim 1, wherein the step of the first annealing is performed using oxygen containing gas at a temperature of about 200° C. to about 500° C.

12. The method of claim 11, wherein the oxygen containing gas includes a gas selected from the group consisting of $O_2$ gas, $N_2O$ gas, $O_3$ gas, and mixtures thereof.

13. The method of claim 11, wherein the oxygen containing gas comprises oxygen of about 0.01% to about 100%.

14. The method of claim 1, wherein the step of the first annealing is performed in-situ or in a furnace.

15. The method of claim 1, wherein the step of the second annealing is performed at a temperature of about 300° C. to about 700° C.

16. The method of claim 9, wherein the dielectric layer includes a multi-layer formed from two or more of the selected materials.

17. A method for manufacturing a capacitor of a semiconductor device, the method comprising the step of:

forming an insulating layer on a substrate;

forming a lower electrode on the insulating layer;

treating the lower electrode with plasma of at least one gas, wherein the at least one gas includes nitrogen or oxygen;

forming a buffer layer on the lower electrode using a rapid thermal nitridation (RTN) process;

forming a dielectric layer on the buffer layer;

forming a upper electrode on the dielectric layer;

first annealing the capacitor in a gas atmosphere including oxygen, wherein the gas including oxygen is $O_2$, $N_2O$, and $O_3$ and the capacitor includes the lower electrode, the buffer layer, the dielectric layer, and the second electrode; and Second annealing the capacitor under vacuum, whereby further improving a leakage characteristics of the semiconductor device.

* * * * *